United States Patent
Nakamura et al.

(10) Patent No.: US 9,960,789 B2
(45) Date of Patent: May 1, 2018

(54) OPTICAL TRANSMITTER, OPTICAL COMMUNICATION SYSTEM, AND OPTICAL COMMUNICATION METHOD

(71) Applicant: NEC Corporation, Minato-ku, Tokyo (JP)

(72) Inventors: Tatsuya Nakamura, Tokyo (JP); Emmanuel Le Taillandier De Gabory, Tokyo (JP); Junichi Abe, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days. days.

(21) Appl. No.: 15/544,299

(22) PCT Filed: Jan. 20, 2016

(86) PCT No.: PCT/JP2016/000270
§ 371 (c)(1),
(2) Date: Jul. 18, 2017

(87) PCT Pub. No.: WO2016/121341
PCT Pub. Date: Aug. 4, 2016

(65) Prior Publication Data
US 2017/0373704 A1 Dec. 28, 2017

(30) Foreign Application Priority Data
Jan. 28, 2015 (JP) .................................. 2015-014031

(51) Int. Cl.
*H03M 1/22* (2006.01)
*H03M 13/23* (2006.01)
(Continued)

(52) U.S. Cl.
CPC .......... *H03M 13/23* (2013.01); *H04B 10/516* (2013.01); *H04J 11/00* (2013.01)

(58) Field of Classification Search
CPC ........ H03M 13/23; H04B 10/516; H04J 11/00
(Continued)

(56) References Cited

U.S. PATENT DOCUMENTS 8,112,001 B2 * 2/2012 Lowery .............. H04B 10/2543
398/158
8,467,687 B2 * 6/2013 Sasaki .................... H04J 14/02
398/141
(Continued)

FOREIGN PATENT DOCUMENTS

JP  H07-307685 A  11/1995
JP  H11-163823 A   6/1999
(Continued)

OTHER PUBLICATIONS

Leonardo D. Coelho and Norbert Hanik, "Global Optimization of Fiber-Optic Communication Systems using Four-Dimensional Modulation Formats," in European Conference on Optical Communications (ECOC 2011), Technical Digest, paper Mo. 2.B.4. (total 3 pages).

(Continued)

*Primary Examiner* — Khai M Nguyen

(57) ABSTRACT

If a configuration is employed in which modulation schemes used for an optical communication system can be switched depending on transmission conditions, it is difficult to make effective utilization of frequency resources without the power consumption increasing and the control becoming complex; therefore, an optical transmitter according to an exemplary aspect of the present invention includes an interface means for converting a digital signal to be transmitted under a predetermined transmission condition over an optical carrier wave into a parallel signal with a predetermined bit number at a predetermined transmission rate, and outputting the parallel signal; an encoding means for encoding the parallel signal using one coding system from among a (Continued)

plurality of convolutional coding systems with different degrees of redundancy; a mapping means for mapping an output bit signal output from the encoding means to a modulation symbol; an optical modulation means for modulating the optical carrier wave based on a symbol signal output from the mapping means; and an encoding control means for selecting a predetermined coding system corresponding to the predetermined transmission condition from among the plurality of convolutional coding systems and controlling the interface means, the encoding means, the mapping means, and the optical modulation means in such a way as to operate in accordance with the predetermined coding system.

20 Claims, 12 Drawing Sheets

(51) Int. Cl.
*H04B 10/516* (2013.01)
*H04J 11/00* (2006.01)
(58) Field of Classification Search
USPC .................................. 341/13; 398/182, 198
See application file for complete search history.

(56) References Cited

U.S. PATENT DOCUMENTS

| 2009/0185638 A1 | 7/2009 | Imamura et al. |
| 2009/0196602 A1 | 8/2009 | Saunders et al. |
| 2011/0255876 A1 | 10/2011 | Sugihara et al. |

FOREIGN PATENT DOCUMENTS

| JP | 2010-34834 A | 2/2010 |
| JP | 2011-514736 A | 5/2011 |
| JP | 2013-009023 A | 1/2013 |
| WO | 2007/136002 A1 | 11/2007 |
| WO | 2010/082578 A1 | 7/2010 |

OTHER PUBLICATIONS

Shota Ishimura and Kazuro Kikuchi, "8-State Trellis-Coded Optical Modulation with 4-Dimensional QAM Constellations," Optical Fibre Technology, 2014 OptoElectronics and Communication Conference and Australian Conference on Optical Fibre Technology, Jul. 2014, pp. 1013-1015. (total 5 pages).
International Search Report dated Mar. 15, 2016, in counterpart International Application No. PCT/JP2016/000270.
Written Opinion of the International Searching Authority dated Mar. 15, 2016, in counterpart International Application No. PCT/JP2016/000270.

* cited by examiner

OPTICAL TRANSMITTER, OPTICAL COMMUNICATION SYSTEM, AND OPTICAL COMMUNICATION METHOD

This application is a National Stage Entry of PCT/JP2016/000270 filed on Jan. 20, 2016, which claims priority from Japanese Patent Application 2015-014031 filed on Jan. 28, 2015, the contents of all of which are incorporated herein by reference, in their entirety.

TECHNICAL FIELD

The present invention relates to optical transmitters, optical communication systems, and optical communication methods and, in particular, to an optical transmitter, an optical communication system, and an optical communication method that perform optical coded modulation using digital signals.

BACKGROUND ART

It is important in an optical communication system using optical fibers to increase the receiving sensitivity and the frequency utilization efficiency per optical fiber in order to achieve a long-distance and large-capacity communication. It has been proposed to switch to use various modulation schemes that differ in the reachable transmission distance and the frequency utilization efficiency depending on a transmission distance and a transmission capacity that are required because the optical communication has a trade-off relationship between increase in transmission distance and improvement in frequency utilization efficiency. Examples of modulation schemes that differ in the reachable transmission distance and the frequency utilization efficiency include BPSK (binary phase shift keying), QPSK (quadrature phase shift keying), 8QAM (quadrature amplitude modulation), and 16QAM.

One example of optical transmitters that switch to use modulation schemes is described in Patent Literature 1. The related adjustable bit rate optical transmitter described in Patent Literature 1 includes a digital signal processing (DSP) unit and accompanying digital to analog conversion (DAC) circuitry and drives different programmable Mary-Quadrature Amplitude Modulation (M-QAM) schemes. The DSP is programmed to apply a control algorithm and select a proper QAM scheme from the multiple QAM schemes for the signal modulation of the optical transmitter. It is said that the configuration makes it possible to maintain a desired level of transmission performance or optimize the transmission performance without the need for replacing the optical transmitter.

The related adjustable bit rate optical transmitter, however, has the problem that frequency utilization efficiency has a surplus depending on conditions because the granularity is coarse in switching modulation schemes. If a single optical transceiver switches to use a plurality of modulation schemes such as BPSK, QPSK, 8QAM, and 16QAM, it is necessary to implement a digital signal processing circuit having a plurality of algorithms and bit precision that correspond to the plurality of modulation schemes. Consequently, there has been the problem that the power consumption of the optical transmitter and an optical receiver increases, and the control of them becomes complex.

A set-partitioning method in a multi-dimensional signal space is one of the methods by which making the granularity in switching modulation schemes fine down is balanced with preventing the signal processing circuit from getting complex under the above-described trade-off relationship between the transmission distance and the frequency utilization efficiency. The set-partitioning method has gotten attention recently because it has a high affinity for optical signals that are four-dimensional signals intrinsically. For example, Non Patent Literature 1 discloses a technology of obtaining coding gain through multi-dimensional optical coded modulation, that is, SP (set-partitioning)-32-4D (dimensions)-16QAM and SP-128-4D-16QAM.

Non Patent Literature 2 discloses a trellis-coded optical modulation scheme in which convolutional codes are combined with a set-partitioning method, as a method of achieving a transmission distance that exceeds a transmission distance anticipated from the above-mentioned trade-off relationship between a transmission distance and frequency utilization efficiency. The trellis-coded modulation enables a least-square free distance between code sequences to be extended by the convolutional encoding to the square of the distance between signals in the states that are partitioned by the set-partitioning method. This makes it possible to obtain coding gain that surpasses one achieved by the set-partitioning method.

CITATION LIST

Patent Literature

[PTL 1]
Japanese Unexamined Patent Application Publication (Translation of PCT Application) No. 2011-514736

Non Patent Literature

[NPL 1]
Leonardo D. Coelho and Norbert Hanik, "Global Optimization of Fiber-Optic Communication Systems using Four-Dimensional Modulation Formats," in European Conference on Optical Communications (ECOC 2011), Technical Digest, paper Mo. 2.B.4.

[NPL 2]
Shota Ishimura and Kazuro Kikuchi, "8-State Trellis-Coded Optical Modulation with 4-Dimensional QAM Constellations," in OptoElectronics and Communications Conference (OECC2014) Technical Digest, paper TH12B-2.

SUMMARY OF INVENTION

Technical Problem

The above-mentioned trellis-coded modulation has limited scope of application because it has a fewer options of redundancy than the set-partitioning method has. Accordingly, there are restrictions on achieving both an effect due to finer granularity in switching of frequency utilization efficiency by the set-partitioning method and an effect due to extension of a transmission distance by the trellis-coded modulation. As a result, there has been the problem that it is difficult to make effective utilization of frequency resources.

As mentioned above, there has been the problem that, if a configuration is employed in which modulation schemes used for an optical communication system can be switched depending on transmission conditions, it is difficult to make effective utilization of frequency resources without the power consumption increasing and the control becoming complex.

The objective of the present invention is to provide an optical transmitter, an optical communication system, and an optical communication method that solve the above-mentioned problem that, if a configuration is employed in which modulation schemes used for an optical communication system can be switched depending on transmission conditions, it is difficult to make effective utilization of frequency resources without the power consumption increasing and the control becoming complex.

Solution to Problem

An optical transmitter according to an exemplary aspect of the present invention includes an interface means for converting a digital signal to be transmitted under a predetermined transmission condition over an optical carrier wave into a parallel signal with a predetermined bit number at a predetermined transmission rate, and outputting the parallel signal; an encoding means for encoding the parallel signal using one coding system from among a plurality of convolutional coding systems with different degrees of redundancy; a mapping means for mapping an output bit signal output from the encoding means to a modulation symbol; an optical modulation means for modulating the optical carrier wave based on a symbol signal output from the mapping means; and an encoding control means for selecting a predetermined coding system corresponding to the predetermined transmission condition from among the plurality of convolutional coding systems and controlling the interface means, the encoding means, the mapping means, and the optical modulation means in such a way as to operate in accordance with the predetermined coding system.

An optical communication system according to an exemplary aspect of the present invention includes an optical transmitter configured to transmit an optical modulation signal to an optical transmission medium; and an optical receiver configured to receive the optical modulation signal propagated through the optical transmission medium, wherein the optical transmitter includes an interface means for converting a digital signal to be transmitted under a predetermined transmission condition over an optical carrier wave into a parallel signal with a predetermined bit number at a predetermined transmission rate, and outputting the parallel signal; an encoding means for encoding the parallel signal using one coding system from among a plurality of convolutional coding systems with different degrees of redundancy; a mapping means for mapping an output bit signal output from the encoding means to a modulation symbol; an optical modulation means for modulating the optical carrier wave based on a symbol signal output from the mapping means; and an encoding control means for selecting a predetermined coding system corresponding to the predetermined transmission condition from among the plurality of convolutional coding systems and controlling the interface means, the encoding means, the mapping means, and the optical modulation means in such a way as to operate in accordance with the predetermined coding system, and the optical receiver includes a photoelectric conversion means for receiving the optical modulation signal, converting the optical modulation signal into an electric signal, and outputting a received signal, a decoding means for receiving input of the received signal and decoding the received signal using one of a plurality of decoding systems, and a decoding control means for selecting a predetermined decoding system from among the plurality of decoding systems and causing the decoding means to operate in accordance with the predetermined decoding system.

An optical communication method according to an exemplary aspect of the present invention includes converting a digital signal to be transmitted under a predetermined transmission condition over an optical carrier wave into a parallel signal with a predetermined bit number at a predetermined transmission rate; encoding the parallel signal using a predetermined coding system corresponding to the predetermined transmission condition from among a plurality of convolutional coding systems with different degrees of redundancy; generating a symbol signal by mapping a bit signal encoded in the encoding the parallel signal to a modulation symbol; and generating an optical modulation signal by modulating the optical carrier wave based on the symbol signal.

Advantageous Effects of Invention

According to the optical transmitter, the optical communication system, and the optical communication method of the present invention, it is possible to make effective utilization of frequency resources without the power consumption increasing and the control becoming complex even though a configuration is employed in which modulation schemes used for an optical communication system can be switched depending on transmission conditions.

EXAMPLE EMBODIMENT

Example embodiments of the present invention will be described below with reference to the drawings. The directions of arrows in the drawings are illustrative and do not limit the directions of signals between blocks.

First Example Embodiment

Figure 1:
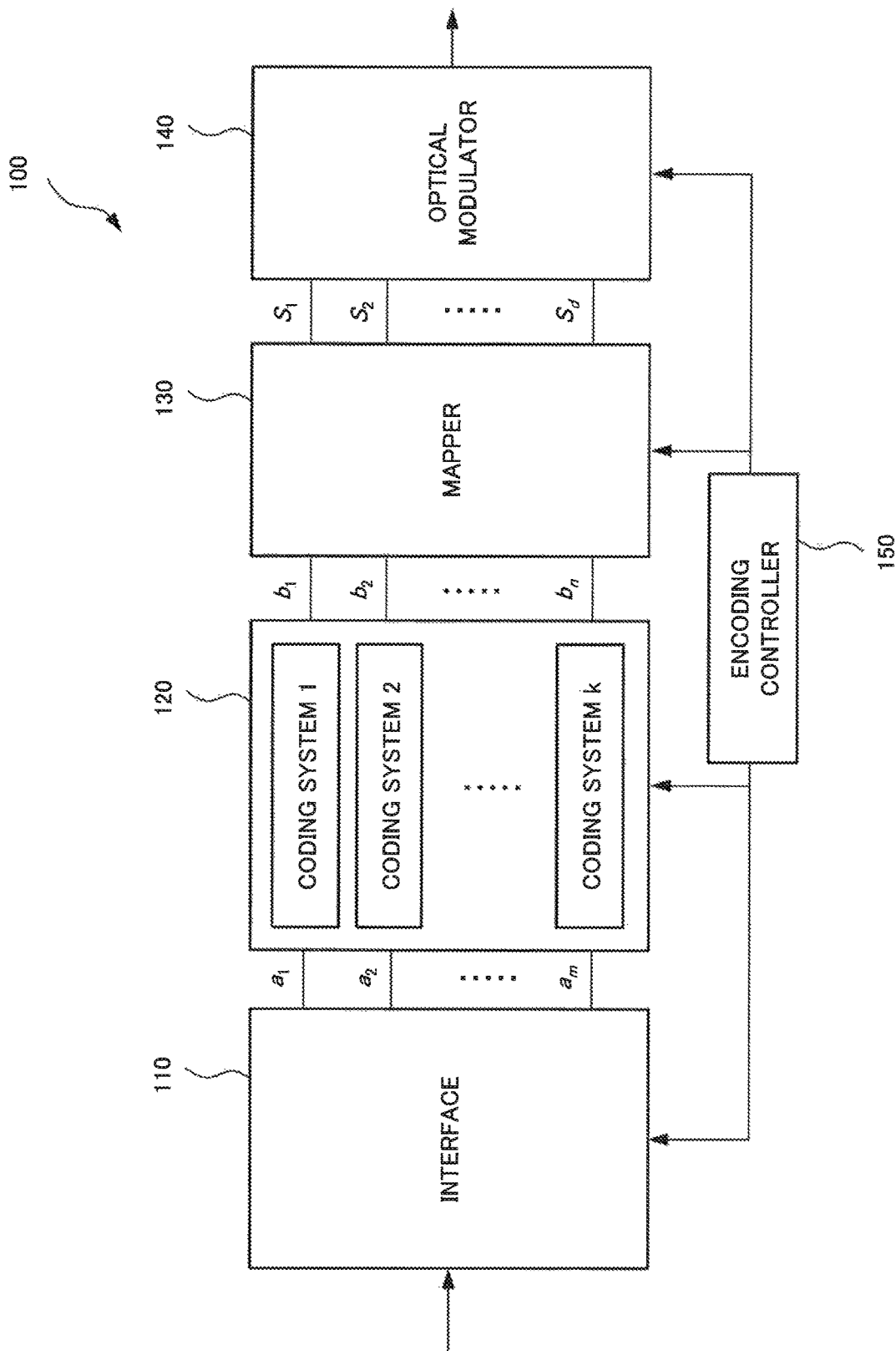
FIG. 1 is a block diagram illustrating a configuration of an optical transmitter according to a first example embodiment of the present invention.

FIG. 1 is a block diagram illustrating a configuration of an optical transmitter 100 according to a first example embodiment of the present invention. The optical transmitter 100 includes an interface 110, an encoder 120, a mapper 130, an optical modulator 140, and an encoding controller 150.

The interface 110 converts a digital signal to be transmitted under a predetermined transmission condition over an optical carrier wave into a parallel signal with a predetermined bit number at a predetermined transmission rate, and outputs the parallel signal. The encoder 120 encodes the parallel signal using one coding system from among a plurality of convolutional coding systems with different degrees of redundancy. The mapper 130 maps an output bit signal output from the encoder 120 to a modulation symbol. The optical modulator 140 modulates the optical carrier wave based on a symbol signal output from the mapper 130.

The encoding controller 150 selects a predetermined coding system corresponding to a predetermined transmission condition from among a plurality of convolutional coding systems. The encoding controller 150 controls the interface 110, the encoder 120, the mapper 130, and the optical modulator 140 in such a way as to operate in accordance with the predetermined coding system.

The above-mentioned transmission condition includes at least one of a transmission capacity, a transmission distance, an error rate, and an optical signal-to-noise ratio.

Next, the operation of the optical transmitter 100 according to the present example embodiment will be described.

The encoding controller 150 selects an optimum coding system from among coding systems 1 to k in accordance with a predetermined transmission condition such as a transmission distance and a transmission capacity to be required for the communication. According to the selected coding system, the encoding controller 150 sets the method of operation of the interface 110, encoder 120, mapper 130, and optical modulator 140.

The interface 110 performs serial-to-parallel conversion on an input signal and outputs a parallel signal with m bits. The encoder 120 receives input of information bit converted into a parallel form with m-bit, encodes the information bit based on the coding system set by the encoding controller 150, and outputs a bit sequence $b_1$ to $b_n$ with n bits. The mapper 130 maps the bit sequence $b_1$ to $b_n$ to a d-dimensional symbol space, and then outputs a sequence of d pieces of (dimensional) data $S_1, S_2, \ldots, S_d$, to the optical modulator 140.

The optical modulator 140 performs optical modulation based on each of data $S_1, S_2, \ldots, S_d$, and outputs a transmission optical signal that has been optically code-modulated. The optical modulator 140 includes a digital-to-analog converter (D/A converter), a modulator driver, an optical modulator chip, and a light source, which are not shown in the figure.

The interface 110 operates at a predetermined transmission rate that is determined according to a predetermined coding system, converts the input signal into a parallel signal with a predetermined bit number that is determined according to the predetermined coding system, and outputs the parallel signal. That is to say, the interface 110 operates at a different transmission rate in accordance with the coding system set by the encoding controller 150, and performs serial-to-parallel conversion by which a transmission bit sequence inputted at the set transmission rate is converted into an m-bit parallel signal. At this time, the output bit number m of the serial-parallel conversion changes depending on the coding system set by the encoding controller 150. That is to say, if a redundancy bit number of a coding system i (i=1 to k) is ri, the output bit number m becomes n−ri.

The encoder 120 is configured to be capable of setting a coding system selecting it from among k-pieces of coding systems ranging from coding system 1 to coding system k each of which has a different output redundancy bit number. The coding system is determined by the encoding controller 150. A parallel signal with m-bit is inputted, and an output bit signal with n-bit is output.

The mapper 130 allocates the output signal with n-bit from the encoder 120 to a d-dimensional symbol space so as to obtain coding gain due to trellis-coded modulation. Then mapper 130 converts it into a symbol signal, that is, a data stream $S_1, S_2, \ldots S_d$, by which an optical modulator chip included in the optical modulator 140 is driven. As the data stream $S_1, S_2, \ldots S_d$, by which the optical modulator is driven, it is possible to use a signal having at least one dimension of the dimensions including an optical phase (I component and Q component), a polarization (X polarization component and Y polarization component), a wavelength, and time, pertaining to an optical carrier wave. A combination of plurality of these dimensions makes it possible to perform a high-dimensional optical coded modulation.

The optical modulator chip included in the optical modulator 140 is formed including any of ferroelectric material such as lithium niobate ($LiNbO_3$) and semiconductor material. Using such an optical modulator alone or using a plurality of those optical modulators in combination makes it possible to transmit digital signals multiplexed by at least one of polarization multiplexing, wavelength multiplexing, and time division multiplexing.

Next, an optical communication method of the first example embodiment will be described.

In the optical communication method of the present example embodiment, first, a digital signal to be transmitted under a predetermined transmission condition over an optical carrier wave is converted into a parallel signal with a predetermined bit number at a predetermined transmission rate. The parallel signal is encoded using a predetermined coding system corresponding to the predetermined transmission condition from among a plurality of convolutional coding systems with different degrees of redundancy. Then a symbol signal is generated by mapping a bit signal encoded in the above step to a modulation symbol. Finally, an optical modulation signal is generated by modulating the optical carrier wave based on the symbol signal.

The converting to the parallel signal mentioned above can be configured to convert to the parallel signal with a predetermined bit number that is determined according to a predetermined coding system at a predetermined transmission rate that is determined according to the predetermined coding system.

As mentioned above, the optical transmitter 100 and the optical communication method of the present example embodiment are configured to encode the signal selecting a predetermined coding system corresponding to a predetermined transmission condition from among a plurality of convolutional coding systems with different degrees of redundancy. The configuration makes it possible to select a suitable modulation scheme corresponding to a predetermined transmission condition by changing the coding system. This enables the circuit size for the digital signal processing that needs changing in switching a modulation scheme to decrease. As a result, it is possible to make effective utilization of frequency resources without the power consumption increasing and the control becoming complex even though a configuration is employed in which modulation schemes used for an optical communication system can be switched depending on transmission conditions.

Second Example Embodiment

Figure 2:
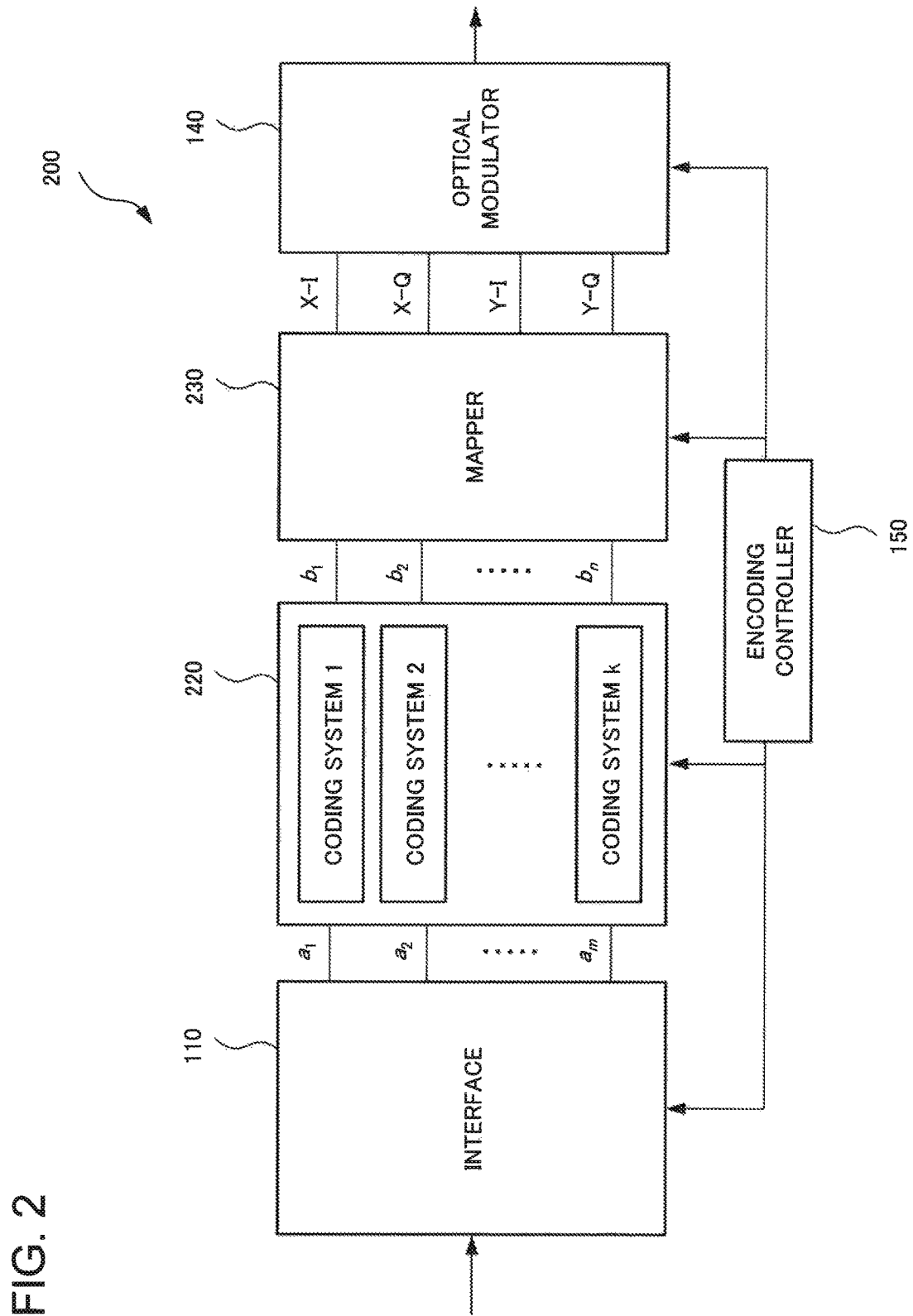
FIG. 2 is a block diagram illustrating a configuration of an optical transmitter according to a second example embodiment of the present invention.

Next, a second example embodiment of the present invention will be described below. FIG. 2 is a block diagram illustrating a configuration of an optical transmitter 200 according to the second example embodiment of the present invention.

The optical transmitter 200 includes an interface 110, an encoder 220, a mapper 230, an optical modulator 140, and an encoding controller 150. The configurations other than the encoder 220 and the mapper 230 included in the optical transmitter 200 according to the present example embodiment are similar to those of the optical transmitter 100 according to the first example embodiment; accordingly, their detailed descriptions will not be repeated.

Figure 3:
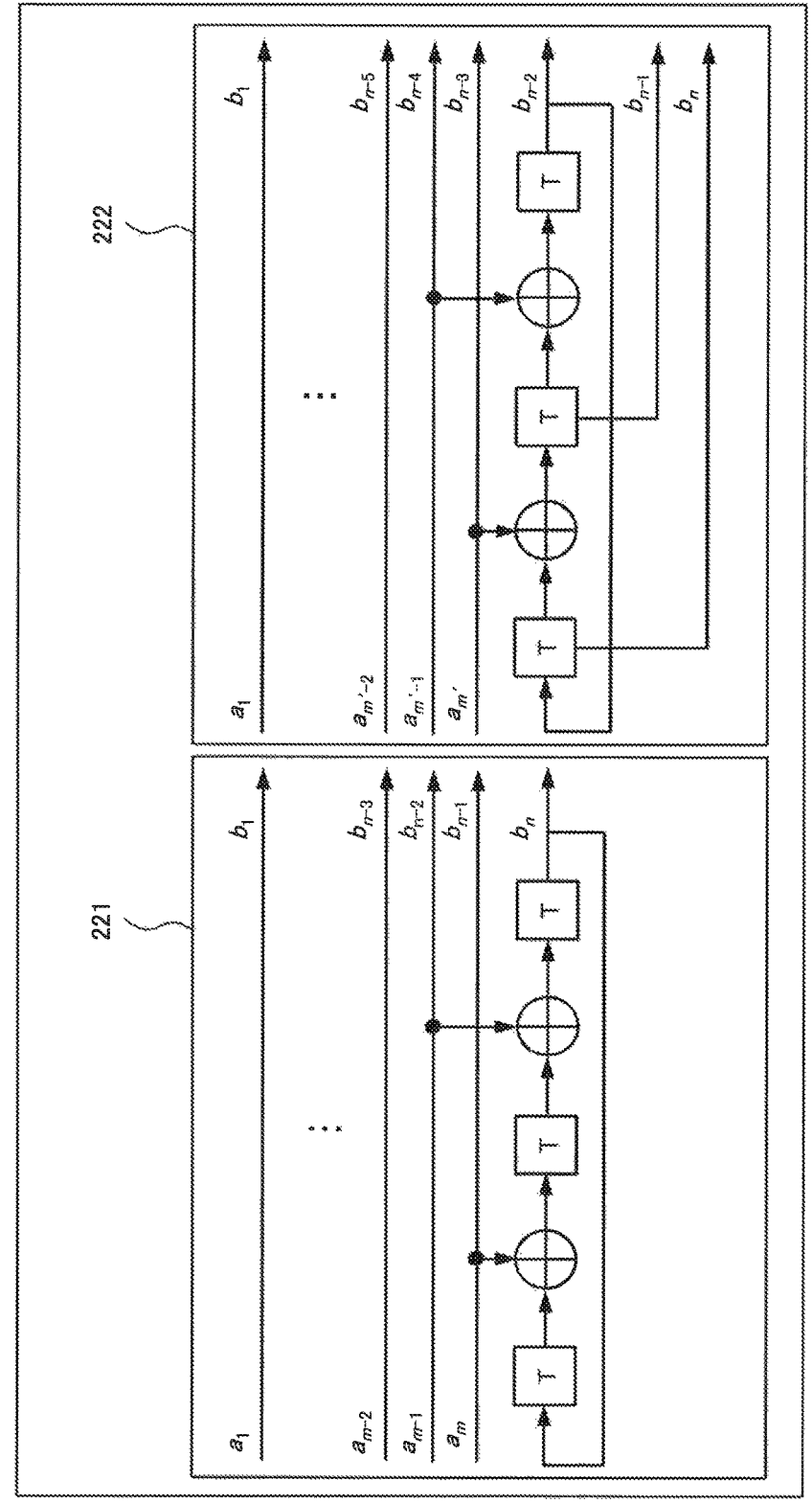
FIG. 3 is a block diagram illustrating a configuration of an encoder included in the optical transmitter according to the second example embodiment of the present invention.

FIG. 3 illustrates an example of the configuration of the encoder 220 included in the optical transmitter 200 according to the second example embodiment. The encoder 220 can configure a plurality of encoder structures each of which has a different redundancy bit number and an equal constraint length in the convolutional coding system. The encoding controller 150 controls the encoder 220 in such a way as to operate and select a single encoder structure from among the plurality of encoder structures.

In the example illustrated in FIG. 3, the encoder 220 has a structure that is configured by switching between a first encoder structure 221 and a second encoder structure 222. In the first encoder structure 221, the input bit number is m bits, the output bit number is n bits, and the redundancy bit number is one bit (m=n−1). In the second encoder structure 222, the input bit number is m' bits, the output bit number is n bits, and the redundancy bit number is three bits (m'=n−3).

Since the first encoder structure 221 and the second encoder structure 222 have the same constraint length (the number of registers) and state transition characteristics, it is possible to select either of the two kinds of coding systems by switching between logical circuits using only a single encoder.

Figure 4:
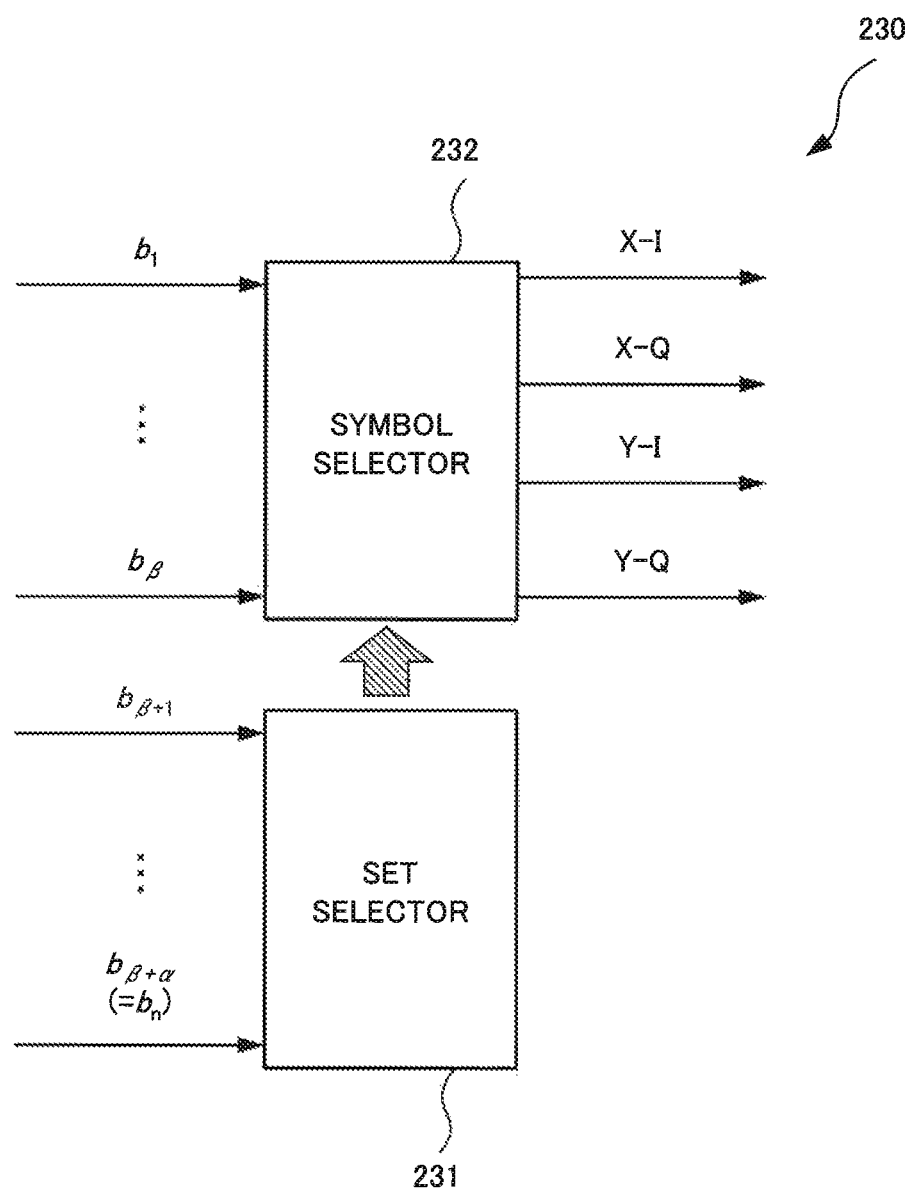
FIG. 4 is a block diagram illustrating a configuration of a mapper included in the optical transmitter according to the second example embodiment of the present invention.

FIG. 4 illustrates an example of the configuration of the mapper 230 included in the optical transmitter 200 of the present example embodiment. The mapper 230 includes a set selector 231 and a symbol selector 232. The set selector 231 receives input with α bits, and the symbol selector 232 receives input with β (=n−α) bits.

The set selector 231 partitions modulation symbols into a plurality of subsets (small sets) and selects one subset from the plurality of subsets (small sets) based on the output bit signal. That is to say, the set selector 231 selects one small set from a plurality of small sets based on the α-bit input signal.

The symbol selector 232 selects one modulation symbol, based on the output bit signal, from modulation symbols included in the selected subset that is selected by the set selector 231, and maps the output bit signal to the selected modulation symbol. That is to say, the symbol selector 232 selects one symbol, based on the β-bit input signal, from $2^\beta$ symbols included in the small set that is selected by the set selector 231, and outputs the symbol to the optical modulator 140. The selected symbol belongs in a four-dimensional symbol space. In the present example embodiment, the optical phase (I component and Q component) and polarization (X polarized component and Y polarized component) of an optical carrier wave are used as the four-dimensional signal space.

Next, the operation of the encoder 220 and mapper 230 included in the optical transmitter 200 according to the present example embodiment will be described.

If the first encoder structure 221 with the redundancy bit number equal to one bit, which is illustrated in FIG. 3, is used, encoded three bits of the output bit signal (n bits) are inputted into the set selector 231 (α=3 bits). The remaining output bit signal that has not been encoded is inputted into the symbol selector 232 (β=n−3 bits).

Figure 5:
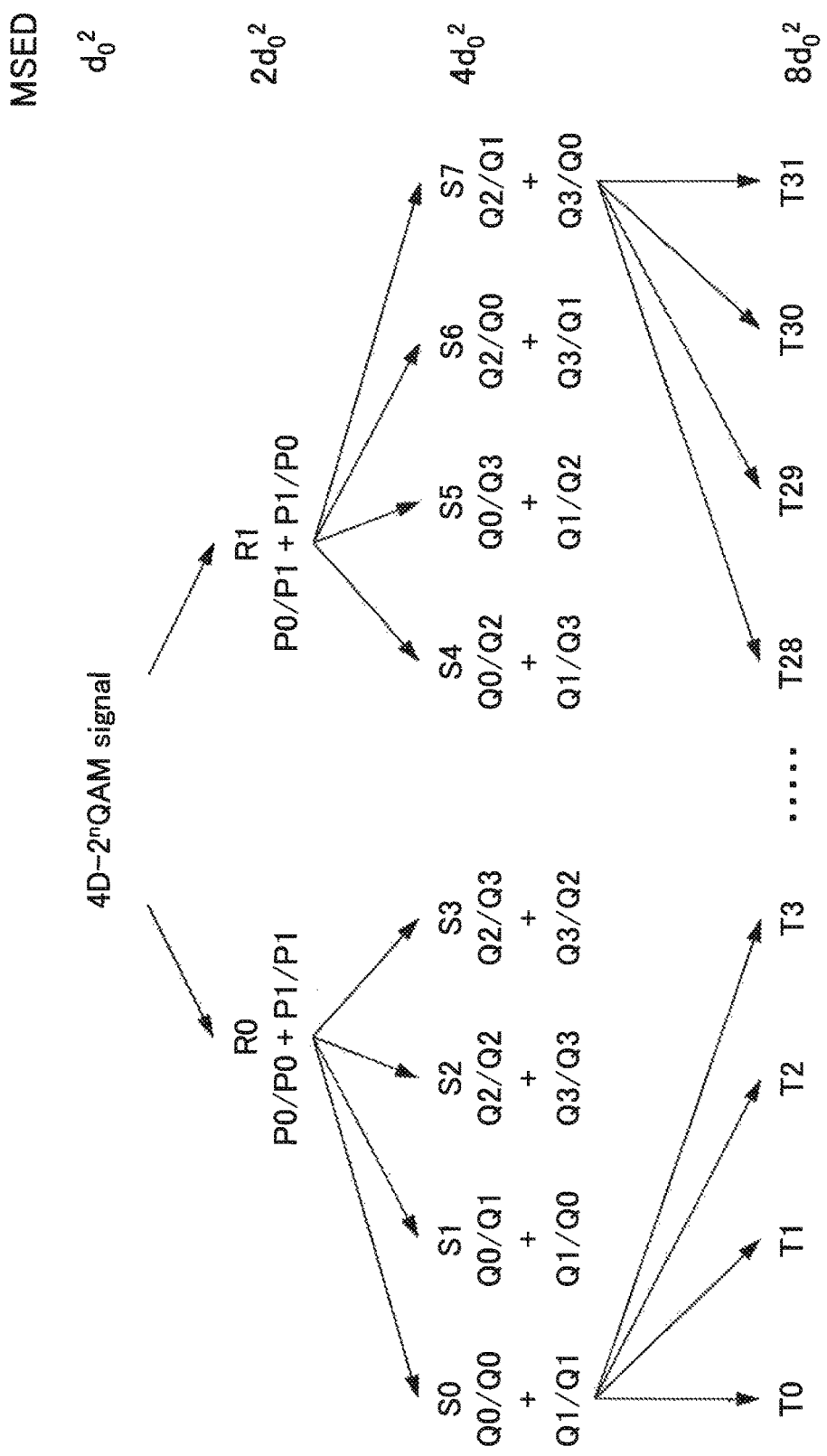
FIG. 5 is a diagram to explain the operation of the mapper included in the optical transmitter according the second example embodiment of the present invention, and a diagram to explain set-partitioning of a QAM constellation in a four-dimensional symbol space.

The set selector 231 partitions a constellation of four-dimensional QAM modulation into eight small sets S0 to S7 that are illustrated in FIG. 5 based on the set-partitioning method. Then the set selector 231 selects one of the small sets using the encoded α bits. The symbol selector 232 selects one symbol, using the β bits that have not been encoded, from a plurality of symbols that belong to the small set selected by the set selector 231, and outputs the selected four-dimensional signal.

If the second encoder structure 222 with the redundancy bit number equal to three bits, which is illustrated in FIG. 3, is used, encoded five bits of the output bit signal (n bits) are inputted into the set selector 231 (α=5 bits). The remaining output bit signal that has not been encoded is inputted into the symbol selector 232 (β=n−5 bits).

The set selector 231 partitions a constellation of four-dimensional QAM modulation into 32 small sets R0 to R31 based on the set-partitioning method. Then the set selector 231 selects one of the small sets using the encoded α bits. The symbol selector 232 selects one symbol, using the β bits that have not been encoded, from a plurality of symbols that belong to the small set selected by the set selector 231, and outputs the selected four-dimensional signal.

The above-mentioned set-partitioning (SP) scheme is the method that the minimum distance between codes is extended by thinning out nearest neighboring points from symbol points. For example, Non Patent Literature 1 discloses an SP-128-16QAM modulation in which symbol partitioning in accordance with the set-partitioning is performed on symbols that are mapped into a four-dimensional signal space of phase information and polarization information. The distance between symbols is extended by using the set-partitioning, which enables receiving sensitivity to improve. The set-partitioning will be described below in more detail.

Figure 6:
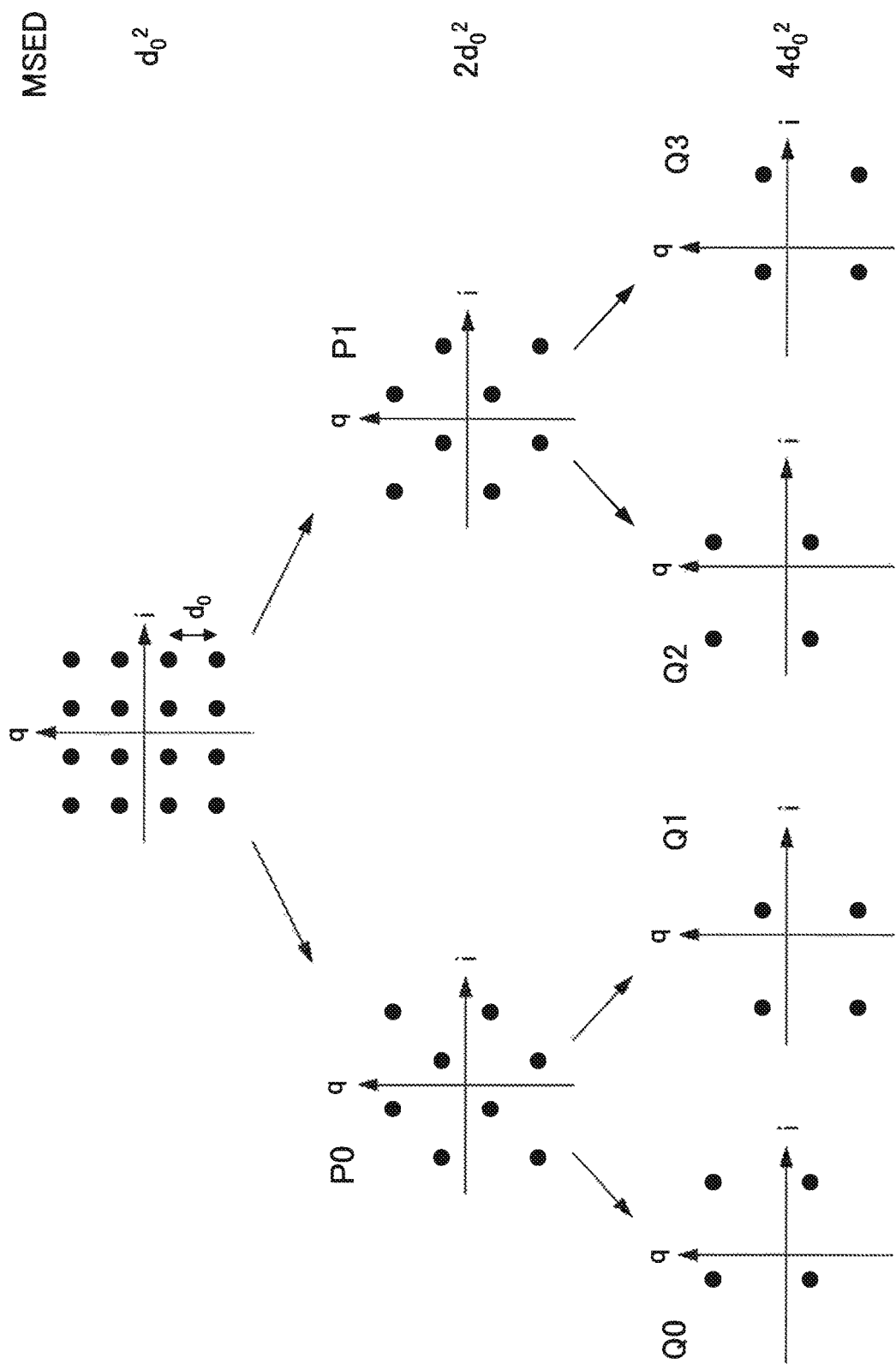
FIG. 6 is a diagram to explain set-partitioning of a QAM constellation in a two-dimensional symbol space.

FIG. 6 illustrates an example of the set-partitioning for a two-dimensional 16QAM constellation. Two-dimensional 16QAM symbols are partitioned into two sets P0 and P1 where the symbols are thinned out evenly. This doubles the minimum squared Euclidean distance (MSED) between symbols in each set. The set-partitioning can be repeated; that is, P0 can be further partitioned into Q0 and Q1, and P1 can be partitioned into Q2 and Q3, as illustrated in FIG. 6. It goes without saying that the set-partitioning can be repeated again depending on the original symbol set. The similar set-partitioning can be performed on two-dimensional $2^n$ QAM signals.

As mentioned above, FIG. 5 is an example of the set-partitioning for four-dimensional $2^n$ QAM. As with the case of two dimensions, four-dimensional $2^n$ QAM symbols are partitioned into sets R0 and R1 where the symbols are thinned out evenly, which doubles the minimum squared Euclidean distance (MSED) between symbols in each set. The set-partitioning in four dimensions can be configured based on the set-partitioning in two dimensions. For example, it is shown in FIG. 5 that R0 is a union including a small set with X polarization P0 and Y polarization P0 and a small set with X polarization P1 and Y polarization P1. Much the same is true on the other set-partitioning. R0 and R1 can be further set-partitioned into eight small sets from S0 to S7. As with the case of the two-dimensional symbol space, it goes without saying that the set-partitioning can be repeated again depending on the original symbol set in the four-dimensional symbol space.

Figure 7:
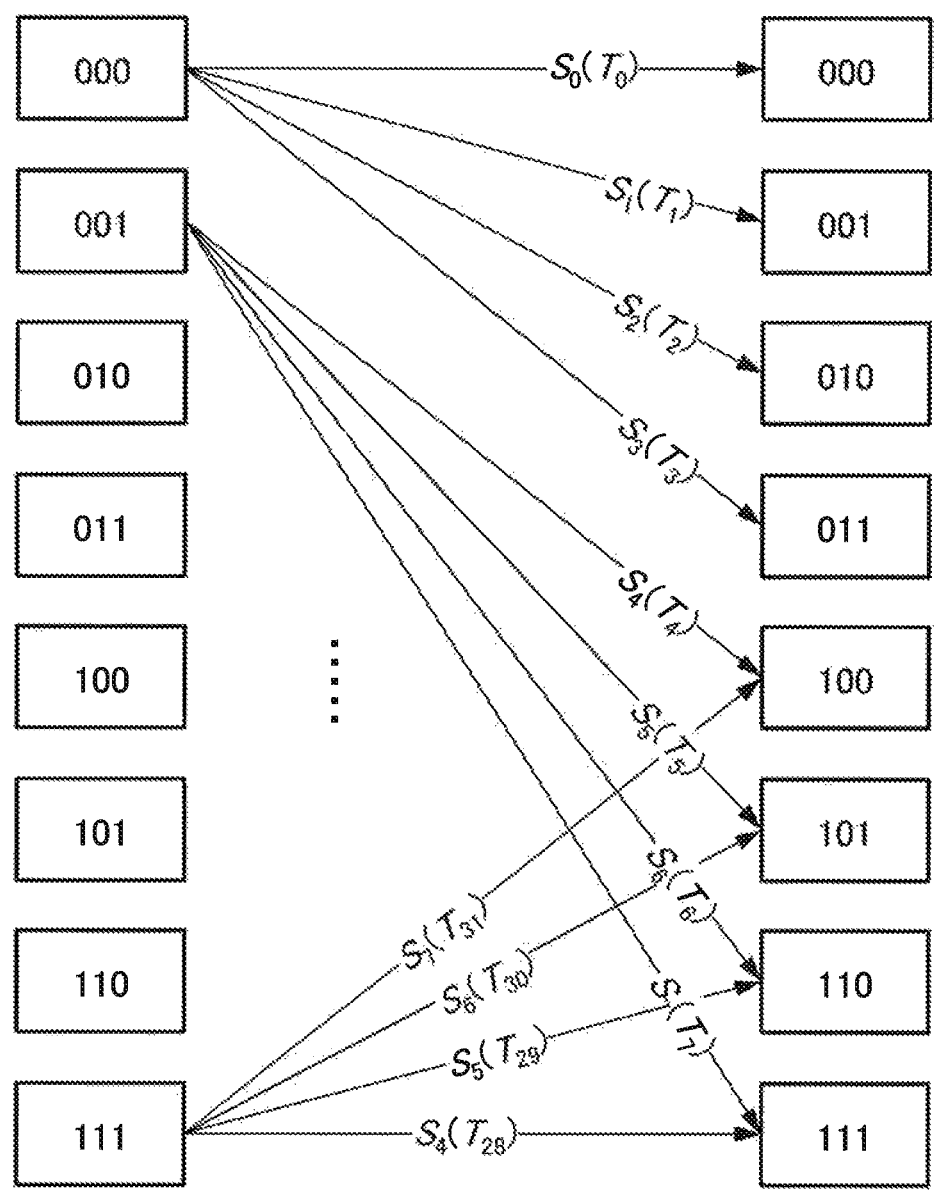
FIG. 7 is a trellis diagram illustrating state transitions in the encoder included in the optical transmitter according to the second example embodiment of the present invention.

The state transition is caused by two bits of input bits in each of the first encoder structure 221 and the second encoder structure 222, which have exactly the same state transition structure. FIG. 7 illustrates a trellis diagram corresponding to state transitions.

When the first encoder structure 221 is used, the redundancy bit is composed of one bit. At this time, one symbol is transmitted that is included in a plurality of symbols in one small set out of small sets S0 to S7 that correspond to the transition, and the minimum squared Euclidean distance (MSED) between the symbols becomes $4d_0^2$. In addition, because the sum of squared distances between symbol sequences also becomes $2\ d_0^2 \times 2 = 4\ d_0^2$, the minimum free distance becomes $4\ d_0^2$. This makes the transmission bit rate $(n-1)/n$ and shows that the receiving sensitivity improves.

When the second encoder structure 222 is used and the redundancy bit is composed of three bits, similarly, one symbol is transmitted that is included in a plurality of symbols in one small set out of small sets T0 to T31 that correspond to the transition, and the minimum squared Euclidean distance (MSED) between the symbols becomes $8d_0^2$. In addition, because the sum of minimum free distances between symbol sequences also becomes $4\ d_0^2 \times 2 = 8\ d_0^2$, the minimum free distance becomes $8d_0^2$. This makes the transmission bit rate $(n-3)/n$ and shows that the receiving sensitivity further improves.

The above-mentioned plurality of coding systems can be set so that they may differ in the reception sensitivity and the coding rate from each other. This makes it possible to select a modulation scheme that uses a suitable coding system depending on a transmission distance and transmission capacity to be required.

In addition, the base constellation is constant even if the coding system is switched, which enables a change in the digital signal processing to be minimized. As a result, it is possible to achieve the effect of extending a transmission distance without the power consumption increasing and the control becoming complex even though a configuration is employed in which modulation schemes used for an optical communication system can be switched depending on transmission conditions.

In addition, the component count can be reduced because a physical interface such as an optical modulator can be shared between coding systems. This enables the cost of the optical transmitter to be reduced and the control to be simplified.

Next, an optical communication method according to the second example embodiment will be described.

In the optical communication method of the present example embodiment, first, a digital signal to be transmitted under a predetermined transmission condition over an optical carrier wave is converted into a parallel signal with a predetermined bit number at a predetermined transmission rate. The parallel signal is encoded using a predetermined coding system corresponding to the predetermined transmission condition from among a plurality of convolutional coding systems with different degrees of redundancy. Then a symbol signal is generated by mapping a bit signal encoded in the above step to a modulation symbol. Finally, an optical modulation signal is generated by modulating the optical carrier wave based on the symbol signal.

In generating the symbol signal mentioned above, modulation symbols are partitioned into a plurality of subsets, and one subset is selected from the plurality of subsets based on the bit signal. Then one modulation symbol is selected, based on the bit signal, from modulation symbols included in the selected subset, and the bit signal is mapped to the selected modulation symbol.

As mentioned above, the optical transmitter 200 and the optical communication method of the present example embodiment are configured to encode the signal selecting a predetermined coding system corresponding to a predetermined transmission condition from among a plurality of convolutional coding systems with different degrees of redundancy. The configuration makes it possible to make effective utilization of frequency resources without the power consumption increasing and the control becoming complex even though a configuration is employed in which modulation schemes used for an optical communication system can be switched depending on transmission conditions.

Third Example Embodiment

Figure 8:
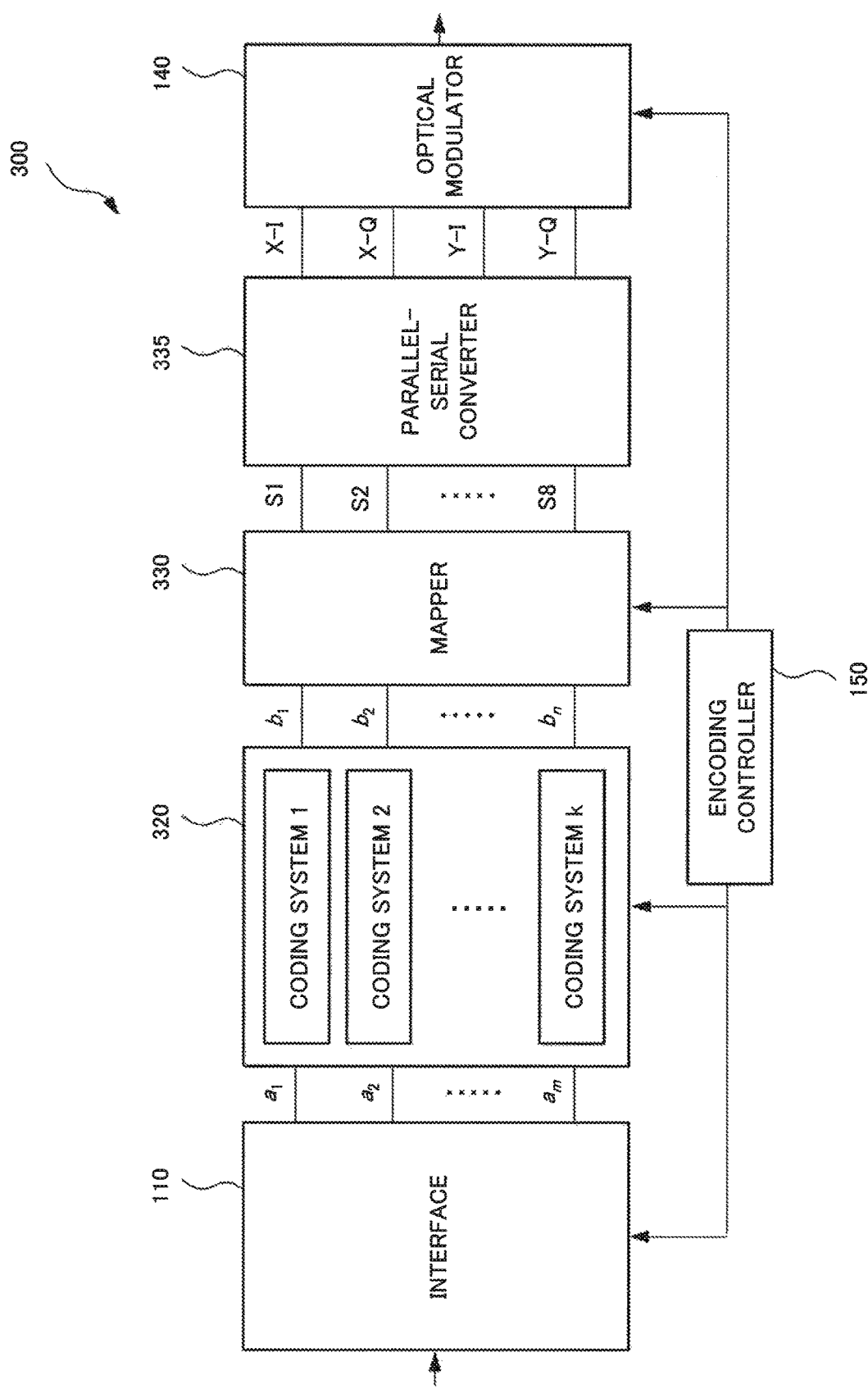
FIG. 8 is a block diagram illustrating a configuration of an optical transmitter according to a third example embodiment of the present invention.

Next, a third example embodiment of the present invention will be described below. FIG. 8 is a block diagram illustrating a configuration of an optical transmitter 300 according to the third example embodiment of the present invention.

The optical transmitter 300 includes an interface 110, an encoder 320, a mapper 330, a parallel-serial converter 335, an optical modulator 140, and an encoding controller 150. The configurations other than the encoder 320, the mapper 330, and the parallel-serial converter 335 included in the optical transmitter 300 according to the present example embodiment are similar to those of the optical transmitter 100 according to the first example embodiment; accordingly, their detailed descriptions will not be repeated.

Figure 9:
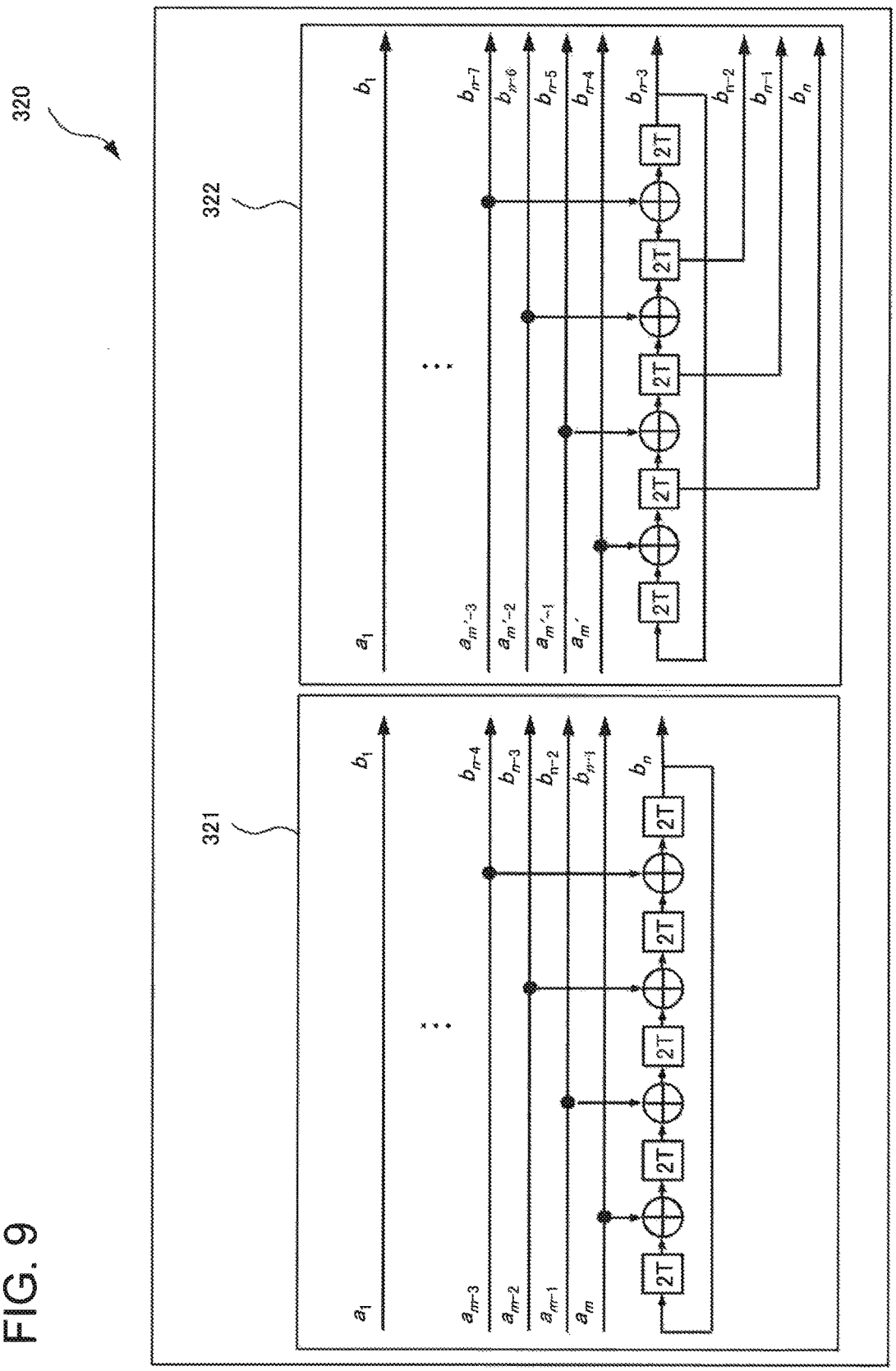
FIG. 9 is a block diagram illustrating a configuration of an encoder included in the optical transmitter according to the third example embodiment of the present invention.

FIG. 9 illustrates an example of the configuration of the encoder 320 included in the optical transmitter 300 according to the third example embodiment. The encoder 320 has a structure that is configured by switching between a first encoder structure 321 and a second encoder structure 322. In the first encoder structure 321, the input bit number is m bits, the output bit number is n bits, and the redundancy bit number is one bit (m=n−1). In the second encoder structure 322, the input bit number is m' bits, the output bit number is n bits, and the redundancy bit number is four bits (m'=n−4).

Since the first encoder structure 321 and the second encoder structure 322 have the same constraint length (the number of registers) and state transition characteristics, it is possible to select either of the two kinds of coding systems by switching between logical circuits using only a single encoder.

Figure 10:
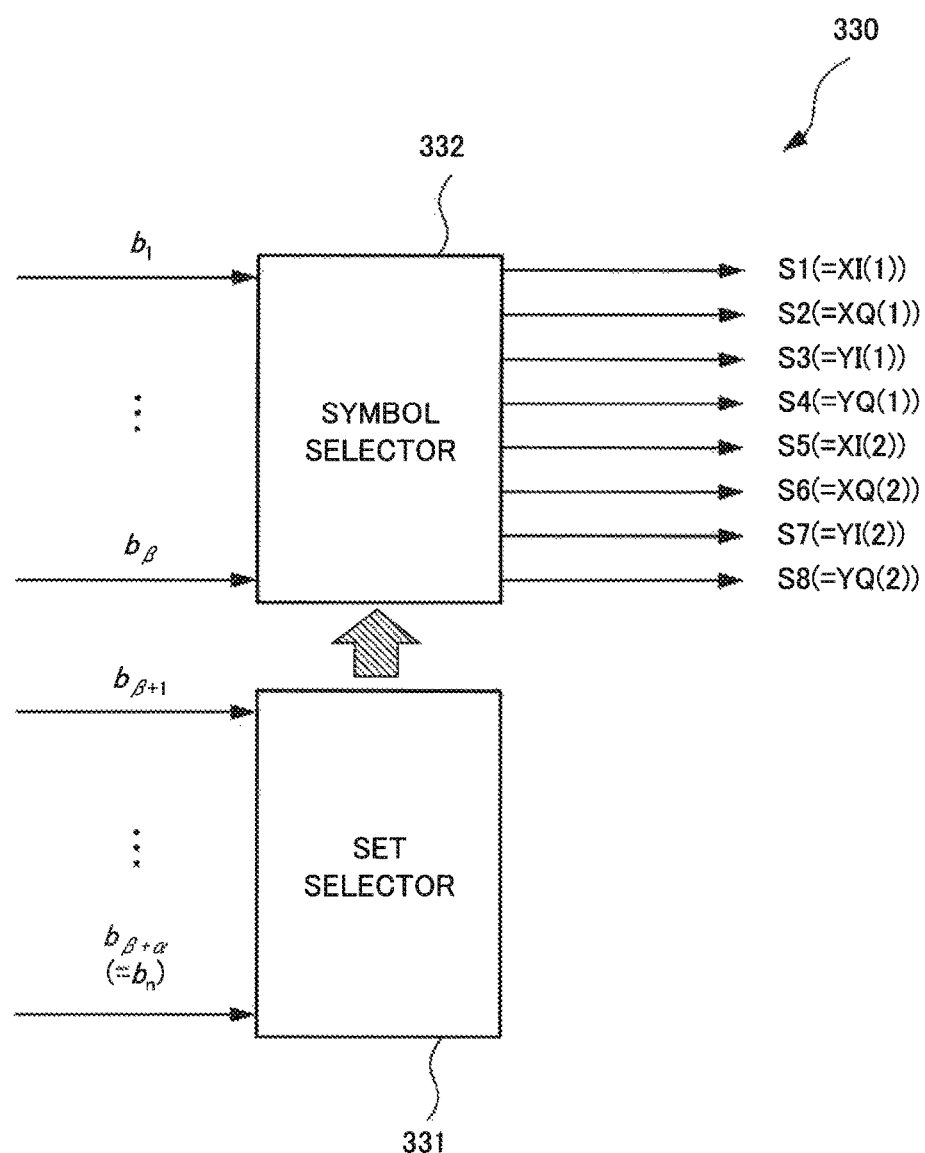
FIG. 10 is a block diagram illustrating a configuration of a mapper included in the optical transmitter according to the third example embodiment of the present invention.

FIG. 10 illustrates an example of the configuration of the mapper 330 included in the optical transmitter 300 of the present example embodiment. The mapper 330 includes a set selector 331 and a symbol selector 332. The set selector 331 receives input with α bits, and the symbol selector 332 receives input with β (=n−α) bits.

The set selector 331 partitions modulation symbols into a plurality of subsets (small sets) and selects one subset from the plurality of subsets (small sets) based on the output bit signal. That is to say, the set selector 331 selects one small set from a plurality of small sets based on the α-bit input signal.

The symbol selector 332 selects one modulation symbol, based on the output bit signal, from modulation symbols included in the selected subset that is selected by the set selector 331, and maps the output bit signal to the selected modulation symbol. That is to say, the symbol selector 332 selects one symbol, based on the β-bit input signal, from $2^\beta$ symbols included in the small set that is selected by the set selector 331, and outputs the symbol to the parallel-serial converter 335. The selected symbol belongs in an eight-dimensional symbol space. In the present example embodiment, the optical phase (I component and Q component), polarization (X polarized component and Y polarized component), and two successive time slots of an optical carrier wave are used as the eight-dimensional signal space.

The parallel-serial converter 335 allocates the eight-dimensional signal output from the mapper 330 to the two time slots respectively as four-dimensional signals, which are output to the optical modulator 140.

Next, the operation of the encoder 320 and the mapper 330 included in the optical transmitter 300 according to the present example embodiment will be described.

If the first encoder structure 321 with the redundancy bit number equal to one bit, which is illustrated in FIG. 9 is used, encoded four bits of the output bit signal (n bits) are inputted into the set selector 331 (α=4 bits). The remaining output bit signal is inputted into the symbol selector 332 (β=n−4 bits).

Figure 11:
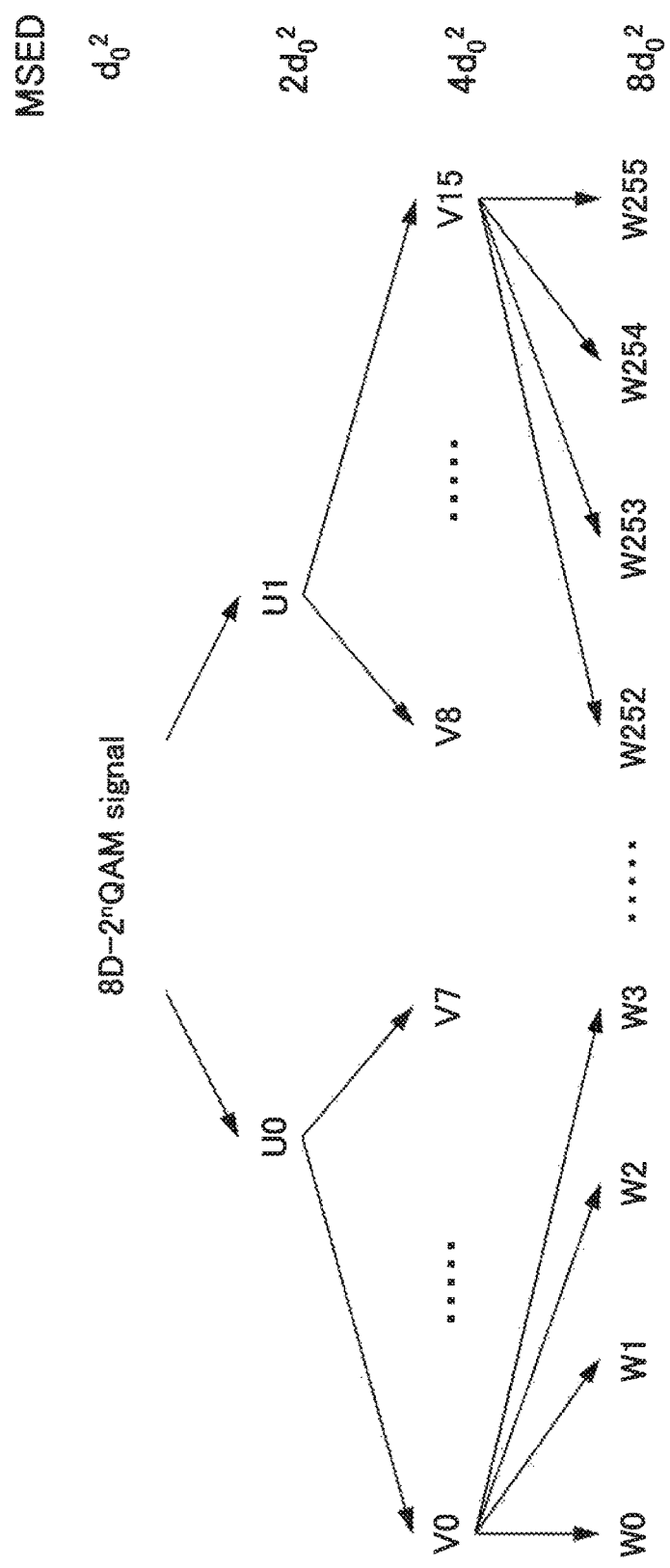
FIG. 11 is a diagram to explain the operation of the mapper included in the optical transmitter according the third example embodiment of the present invention, and a diagram to explain set-partitioning of a QAM constellation in an eight-dimensional symbol space.

The set selector 331 partitions a constellation of eight-dimensional QAM modulation into 16 small sets V0 to V15 that are illustrated in FIG. 11 based on the set-partitioning method. Then the set selector 331 selects one of the small sets using the encoded α bits. The symbol selector 332 selects one symbol from a plurality of symbols that belong to the small set selected by the set selector 331, and outputs the selected eight-dimensional signal.

If the second encoder structure 322 with the redundancy bit number equal to four bits, which is illustrated in FIG. 9, is used, encoded eight bits of the output bit signal (n bits) are inputted into the set selector 331 (α=8 bits). The remaining output bit signal that has not been encoded is inputted into the symbol selector 332 (β=n−8 bits).

The set selector 331 partitions a constellation of eight-dimensional QAM modulation into 256 small sets W0 to W255 that are illustrated in FIG. 11 based on the set-partitioning method. Then the set selector 331 selects one of the small sets using the encoded α bits. The symbol selector 332 selects one symbol from a plurality of symbols that belong to the small set selected by the set selector 331, and outputs the selected eight-dimensional signal.

The set-partitioning in the eight-dimensional symbol space illustrated in FIG. 11 is similar to the set-partitioning in the four-dimensional symbol space that has been described in the second example embodiment; accordingly, the detailed description will not be repeated.

As with the case of the four-dimensional symbol space illustrated in the second example embodiment, when the redundancy bit is composed of one bit, the minimum free distance becomes $4d_0^2$. This makes the transmission bit rate (n−1)/(2n) and shows that the receiving sensitivity improves. When the redundancy bit is composed of four bits, the minimum free distance becomes $8d_0^2$. This makes the transmission bit rate (n−4)/(2n) and shows that the receiving sensitivity further improves.

The above-mentioned plurality of coding systems can be set so that they may differ in the reception sensitivity and the coding rate from each other. This makes it possible to select a modulation scheme that uses a suitable coding system depending on a transmission distance and transmission capacity to be required.

As mentioned above, the optical transmitter 300 of the present example embodiment are configured to encode the signal selecting a predetermined coding system corresponding to a predetermined transmission condition from among a plurality of convolutional coding systems with different degrees of redundancy. The configuration makes it possible to make effective utilization of frequency resources without the power consumption increasing and the control becoming complex even though a configuration is employed in which modulation schemes used for an optical communication system can be switched depending on transmission conditions.

Although the second example embodiment and the third example embodiment have been described using four-dimensional and eight-dimensional QAM signals respectively as examples, the present invention can also be applied if other dimensional QAM signals are used. In addition, it goes without saying that the present invention can also be applied to signals that can be set-partitioned other than QAM signals.

The examples in which the trellis-coded modulation is used have been described in the second example embodiment and third example embodiment as. The present invention, however, is not limited to the above examples, and it goes without saying that the present invention can also be applied even though the turbo trellis-coded modulation, the bit-interleaved coded modulation, and the like are used as long as the modulation method is based on a convolutional encoder and a trellis diagram.

Fourth Example Embodiment

Figure 12:
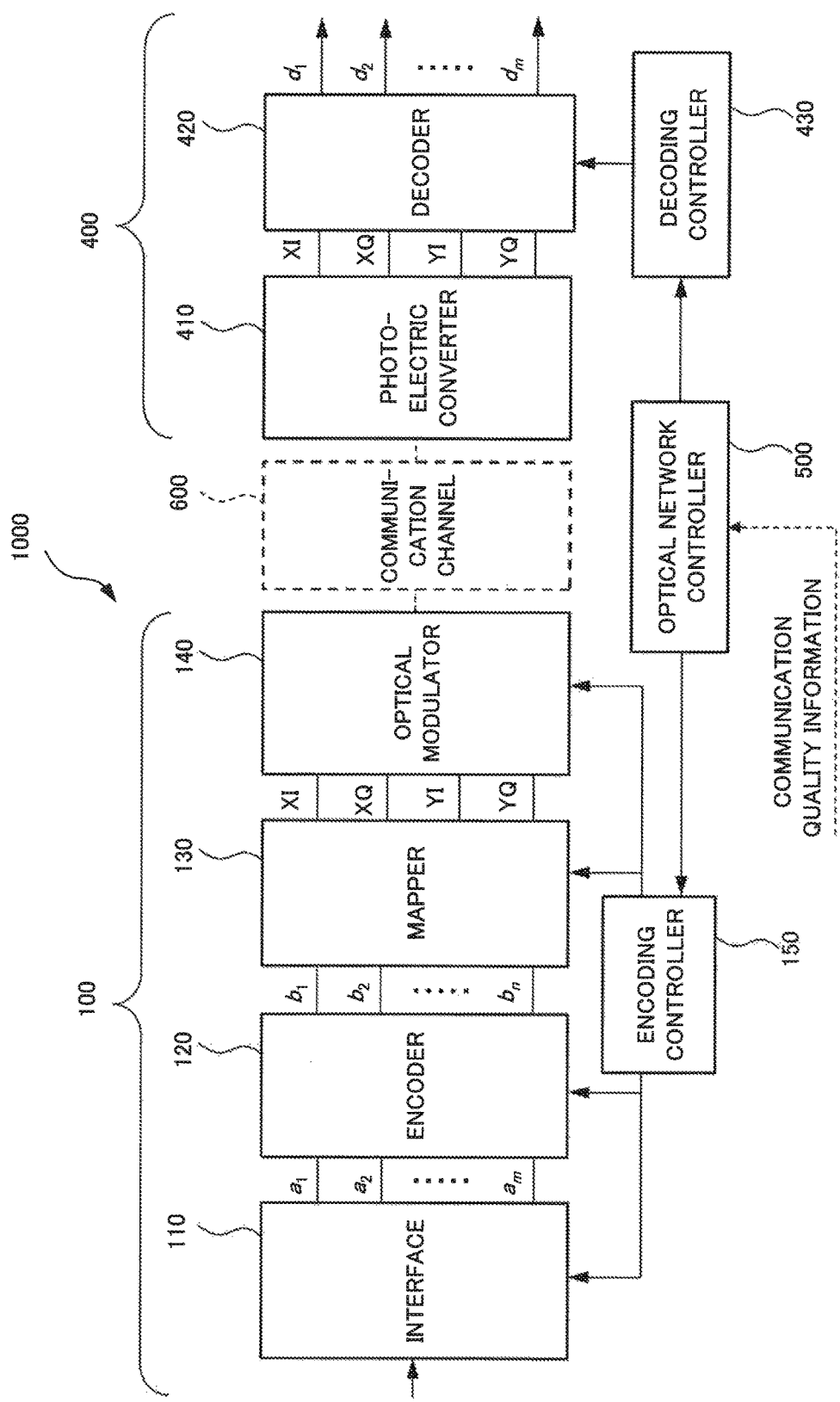
FIG. 12 is a block diagram illustrating a configuration of an optical communication system according to a fourth example embodiment of the present invention.

Next, a fourth example embodiment of the present invention will be described below. FIG. 12 is a block diagram illustrating a configuration of an optical communication system 1000 according to the fourth example embodiment of the present invention.

The optical communication system 1000 includes an optical transmitter 100 configured to transmit an optical modulation signal to a communication channel (optical transmission medium) 600 and an optical receiver 400 configured to receive the optical modulation signal propagated through the communication channel 600.

The optical transmitter 100 includes an interface 110, an encoder 120, a mapper 130, an optical modulator 140, and an encoding controller 150. The configuration and the operation of the optical transmitter 100 are similar to those of the optical transmitter according to the first example embodiment; accordingly, their detailed descriptions will not be repeated.

The optical receiver 400 includes a photoelectric converter 410, a decoder 420, and a decoding controller 430.

The photoelectric converter 410 receives an optical modulation signal, converts the optical modulation signal into an electric signal, and outputs a received signal. The decoder 420 receives input of the received signal and decodes the received signal using one of a plurality of decoding systems. The decoding controller 430 selects a predetermined decoding system from among the plurality of decoding systems and causes the decoder 420 to operate in accordance with the predetermined decoding system.

Next, the operation of the optical communication system 1000 according to the present example embodiment will be described. The operation of the optical transmitter 100 to output an optical signal on which an optical coded modulation has been performed is similar to that in the first example embodiment; accordingly, the description will not be repeated.

The optical signal output from the optical modulator 140 included in the optical transmitter 100 passes through the communication channel 600 and is received by the photoelectric converter 410 included in the optical receiver 400. The photoelectric converter 410 converts the received optical signal into an electric signal and outputs the received signal as digital signals in each lane of XI-ch, XQ-ch, YI-ch, and YQ-ch. The photoelectric converter is configured to include a 90-degree hybrid, a photodiode, a transimpedance amplifier, and an A/D (analog-to-digital) converter, which are not illustrated in the figure.

The decoder 420 selects one of the plurality of decoding systems in accordance with a setting by the decoding controller 430. The above-mentioned decoding system includes the soft decision Viterbi decoding system by which the probability with a bit being 1 for each bit is output, the Viterbi decoding system by which a hard decision is performed on a maximum likelihood sequence, and the sequential decoding system for a convolutional code with a longer constraint length.

The optical communication system 1000 can be configured to further include an optical network controller 500. The optical network controller 500 determines a predetermined coding system and a predetermined decoding system that correspond to a predetermined transmission condition, and concurrently notifies the encoding controller 150 and the decoding controller 430 of the predetermined coding system and the predetermined decoding system.

Next, the operation of the optical network controller 500 will be described in further detail.

The optical network controller 500 selects a suitable coding system and a suitable decoding system based on communication quality information such as a transmission distance and a transmission capacity that are transmission conditions required by a system operating side. Then the optical network controller 500 concurrently notifies the encoding controller 150 and the decoding controller 430 of the selection results. Specifically, the optical network controller 500 instructs the encoding controller 150 on the setting of encoding redundancy such as a code rate, and instructs the decoding controller 430 on the setting of the decoding system. The settings of the encoding controller 150 and the decoding controller 430 are concurrently changed, which makes it possible to maintain a suitable reception condition.

It is not necessarily required for the optical network controller 500 to obtain the above-mentioned communication quality information used for the control from the system operating side. It is possible to select a suitable coding system and a suitable decoding method using information such as an optical signal-to-noise ratio and an error rate, for example.

Next, an optical communication method according to the present example embodiment will be described.

In the optical communication method of the first example embodiment, first, a digital signal to be transmitted under a predetermined transmission condition over an optical carrier wave is converted into a parallel signal with a predetermined bit number at a predetermined transmission rate. The parallel signal is encoded using a predetermined coding system corresponding to the predetermined transmission condition from among a plurality of convolutional coding systems with different degrees of redundancy. Then a symbol signal is generated by mapping a bit signal encoded in the above step to a modulation symbol. Finally, an optical modulation signal is generated by modulating the optical carrier wave based on the symbol signal.

Next, the optical modulation signal is received, and a received signal is generated by converting the optical modulation signal into an electric signal. Then the received signal is decoded by selecting a predetermined decoding system from among a plurality of decoding systems.

As mentioned above, the optical communication system 1000 and the optical communication method of the present example embodiment are configured to encode the signal selecting a predetermined coding system corresponding to a predetermined transmission condition from among a plurality of convolutional coding systems with different degrees of redundancy. The configuration makes it possible to make effective utilization of frequency resources without the power consumption increasing and the control becoming complex even though a configuration is employed in which modulation schemes used for an optical communication system can be switched depending on transmission conditions.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2015-014031, filed on Jan. 28, 2015, the disclosure of which is incorporated herein in its entirety by reference.

REFERENCE SIGNS LIST 100, 200, 300 Optical transmitter
110 Interface
120, 220, 320 Encoder
130, 230, 330 Mapper
140 Optical modulator
150 Encoding controller
221, 321 First encoder structure
222, 322 Second encoder structure
231, 331 Set selector
232, 332 Symbol selector
335 Parallel-serial converter
440 Optical receiver
410 Photoelectric converter
420 Decoder
430 Decoding controller
500 Optical network controller
600 Communication channel
1000 Optical communication system

What is claimed is:
1. An optical transmitter, comprising:
an interface configured to convert a digital signal to be transmitted under a predetermined transmission condition over an optical carrier wave into a parallel signal with a predetermined bit number at a predetermined transmission rate, and output the parallel signal;

an encoder configured to encode the parallel signal using one coding system from among a plurality of convolutional coding systems with different degrees of redundancy;
a mapper configured to map an output bit signal output from the encoder to a modulation symbol;
an optical modulator configured to modulate the optical carrier wave based on a symbol signal output from the mapper; and
an encoding controller configured to select a predetermined coding system corresponding to the predetermined transmission condition from among the plurality of convolutional coding systems and control the interface, the encoder, the mapper, and the optical modulator in such a way as to operate in accordance with the predetermined coding system.

2. The optical transmitter according to claim 1, wherein the interface operates at the predetermined transmission rate that is determined according to the predetermined coding system, converts an input signal into a parallel signal with the predetermined bit number that is determined according to the predetermined coding system, and outputs the parallel signal.

3. The optical transmitter according to claim 2, wherein the encoder configures a plurality of encoder structures each of which has a different redundancy bit number and an equal constraint length in each of the plurality of convolutional coding systems, and
the encoding controller controls the encoder in such a way as to operate and select a single encoder structure from among the plurality of encoder structures.

4. The optical transmitter according to claim 1, wherein the encoder configures a plurality of encoder structures each of which has a different redundancy bit number and an equal constraint length in each of the plurality of convolutional coding systems, and
the encoding controller controls the encoder in such a way as to operate and select a single encoder structure from among the plurality of encoder structures.

5. The optical transmitter according to claim 1, wherein the mapper includes a set selector and a symbol selector,
the set selector partitions the modulation symbol into a plurality of subsets, and selects one subset from the plurality of subsets based on the output bit signal, and
the symbol selector selects one modulation symbol, based on the output bit signal, from modulation symbols included in a selected subset that is selected by the set selector, and maps the output bit signal to the modulation symbol that is selected.

6. The optical transmitter according to claim 1, further comprising a parallel-serial converter,
wherein the symbol signal is composed of a signal with one dimension of a position on a time slot in transmitting the digital signal; and
the parallel-serial converter allocates the symbol signal to a different position on the time slot and then outputs the symbol signal to the optical modulator.

7. The optical transmitter according to claim 1, wherein the transmission condition is at least one of a transmission capacity, a transmission distance, an error rate, and an optical signal-to-noise ratio.

8. The optical transmitter according to claim 1, wherein the symbol signal is composed of a signal with at least one dimension of dimensions including an optical phase, a polarization, a wavelength, and time, pertaining to the optical carrier wave.

9. The optical transmitter according to claim 1, wherein an optical modulator chip constituting the optical modulator is configured including any of ferroelectric material and semiconductor material.

10. The optical transmitter according to claim 1, wherein the digital signal is transmitted, multiplexed by at least one of polarization multiplexing, wavelength multiplexing, and time division multiplexing.

11. An optical communication system, comprising:
an optical transmitter configured to transmit an optical modulation signal to an optical transmission medium; and
an optical receiver configured to receive the optical modulation signal propagated through the optical transmission medium,
wherein the optical transmitter includes
an interface configured to convert a digital signal to be transmitted under a predetermined transmission condition over an optical carrier wave into a parallel signal with a predetermined bit number at a predetermined transmission rate, and output the parallel signal;
an encoder configured to encode the parallel signal using one coding system from among a plurality of convolutional coding systems with different degrees of redundancy;
a mapper configured to map an output bit signal output from the encoder to a modulation symbol;
an optical modulator configured to modulate the optical carrier wave based on a symbol signal output from the mapper; and
an encoding controller configured to select a predetermined coding system corresponding to the predetermined transmission condition from among the plurality of convolutional coding systems and control the interface, the encoder, the mapper, and the optical modulator in such a way as to operate in accordance with the predetermined coding system, and
the optical receiver includes
a photoelectric converter configured to receive the optical modulation signal, converting the optical modulation signal into an electric signal, and output a received signal,
a decoder configured to receive input of the received signal and decode the received signal using one of a plurality of decoding systems, and
a decoding controller configured to select a predetermined decoding system from among the plurality of decoding systems and cause the decoder to operate in accordance with the predetermined decoding system.

12. The optical communication system according to claim 11, further comprising
an optical network controller configured to determine the predetermined coding system and the predetermined decoding system corresponding to the predetermined transmission condition, and concurrently notify the encoding controller and the decoding controller of the predetermined coding system and the predetermined decoding system.

13. The optical communication system according to claim 12,
wherein the optical network controller, based on the determining, notifies the encoding controller of encoding redundancy in the convolutional coding system.

14. The optical communication system according to claim 11, wherein the decoding system is any one of a Viterbi decoding system and a sequential decoding system.

15. The optical communication system according to claim 11,
wherein the transmission condition is at least one of a transmission capacity, a transmission distance, an error rate, and an optical signal-to-noise ratio.

16. The optical communication system according to claim 11,
wherein the symbol signal is composed of a signal with at least one dimension of dimensions including an optical phase, a polarization, a wavelength, and time, pertaining to the optical carrier wave.

17. An optical communication method, comprising:
converting a digital signal to be transmitted under a predetermined transmission condition over an optical carrier wave into a parallel signal with a predetermined bit number at a predetermined transmission rate;
encoding the parallel signal using a predetermined coding system corresponding to the predetermined transmission condition from among a plurality of convolutional coding systems with different degrees of redundancy;
generating a symbol signal by mapping a bit signal encoded in the encoding the parallel signal to a modulation symbol; and
generating an optical modulation signal by modulating the optical carrier wave based on the symbol signal.

18. The optical communication method according to claim 17,
wherein the converting to the parallel signal includes converting to the parallel signal with the predetermined bit number that is determined according to the predetermined coding system at the predetermined transmission rate that is determined according to the predetermined coding system.

19. The optical communication method according to claim 17, further comprising
partitioning the modulation symbol into a plurality of subsets, and selecting one subset from the plurality of subsets based on the bit signal; and
selecting one modulation symbol, based on the bit signal, from modulation symbols included in a selected subset that is selected, and mapping the bit signal to the modulation symbol that is selected.

20. The optical communication method according to claim 17, further comprising
receiving the optical modulation signal and generating a received signal by converting the optical modulation signal into an electric signal, and
decoding the received signal by selecting a predetermined decoding system from among a plurality of decoding systems.

* * * * *